United States Patent
Yamamoto

(10) Patent No.: US 7,348,859 B2
(45) Date of Patent: Mar. 25, 2008

(54) CRYSTAL OSCILLATOR

(75) Inventor: Takehiro Yamamoto, Machida (JP)

(73) Assignee: Epson Toyocom Corporation (JP)

( * ) Notice: Subject to any disclaimer, the term of this patent is extended or adjusted under 35 U.S.C. 154(b) by 32 days.

(21) Appl. No.: 11/461,527

(22) Filed: Aug. 1, 2006

(65) Prior Publication Data

US 2007/0024386 A1 Feb. 1, 2007

(30) Foreign Application Priority Data

Aug. 1, 2005 (JP) ............... 2005-223465

(51) Int. Cl.
*H03B 5/32* (2006.01)
(52) U.S. Cl. ............... 331/61; 331/75; 331/158; 331/176
(58) Field of Classification Search ........... 331/60, 331/61, 65, 66, 74–77, 108 D, 116 R, 116 FE, 331/158, 159, 175, 176
See application file for complete search history.

(56) References Cited

U.S. PATENT DOCUMENTS

2003/0098749 A1 * 5/2003 Terasawa et al. ............ 331/74

FOREIGN PATENT DOCUMENTS

JP 2004-356872 12/2004

* cited by examiner

*Primary Examiner*—David Mis
(74) *Attorney, Agent, or Firm*—Harness, Dickey & Pierce, P.L.C.

(57) ABSTRACT

A crystal oscillator that outputs an oscillation output signal of an oscillator circuit oscillated by a crystal resonator as a resonation source via a buffer circuit, includes: a plurality of waveform output circuits provided in the buffer circuit, each converting, when inputted, the oscillation output signal into a different waveform and outputting the converted signal; a circuit selection switch that selects any one of the plurality of waveform output circuits as a waveform output circuit of the buffer circuit; and a memory circuit that stores data used by the circuit selection switch to select any one of the waveform output circuits.

3 Claims, 9 Drawing Sheets

CRYSTAL OSCILLATOR

BACKGROUND

1. Technical Field

The present invention relates to a crystal oscillator particularly suitable as a crystal oscillator having circuits other than a crystal resonator integrated on one chip.

2. Related Art

Conventionally, a temperature-compensated crystal oscillator (TCXO) is widely used in mobile communications apparatuses such as cellular phones.

FIG. 10 is a schematic diagram showing the composition of a conventional temperature-compensated crystal oscillator.

A TCXO 100 shown in FIG. 10 is composed of a crystal resonator 101 and a single-chip IC 102. A TCXO circuit section 103 excluding the crystal resonator 101 and an internal memory circuit 104 are integrated on the single-chip IC 102. The TCXO circuit section 103 is composed of a temperature-compensating voltage generator circuit 105 and a voltage control oscillator circuit 106. The temperature-compensating voltage generator circuit 105 generates a temperature-compensating voltage based on data from the internal memory circuit 104 and outputs the generated voltage to the voltage control oscillator circuit 106.

The voltage control oscillator circuit 106 is a voltage control type oscillator circuit equipped with a voltage variable capacitance element 107 and is considered capable of variable control of oscillation frequency by the temperature-compensating voltage coming from the temperature-compensating voltage generator circuit 105.

The internal memory circuit 104 stores, for example, data used to individually adjust parameters of a cubic coefficient and a primary coefficient of the voltage to the temperature, the voltage being generated at the temperature-compensating voltage generator circuit 105, in order to compensate the frequency temperature characteristics of the crystal resonator 101 expressed by a cubic curve.

JP-A-2004-356872 is an example literature on such a TCXO.

Recently, higher performance is demanded on the TCXO for the mobile phones and the like. Low phase noise characteristics and harmonic spectrum noise elimination are some of the strong demands being made in some cases. For example, it is requested that the phase nose be −135 dBc or less at an offset frequency of 1 kHz and that the harmonics be −15 dBc or less.

It is possible to improve the low phase noise characteristics and to eliminate the harmonic spectrum noise at the same time, if the output waveform of the crystal oscillator 100 is adjusted into a sine wave output. In this case, however, the crystal oscillator 100 becomes a unit only for a use that requires the sine wave output, and the usable range as a crystal oscillator becomes extremely limited.

In other words, with the conventional crystal oscillator, if the demand on its performance differs depending on the purpose of use, it is necessary to produce crystal oscillators equipped with waveform output circuits to satisfy different demands, and, thus, the conventional crystal oscillators stay costly and have not been put in general use.

SUMMARY

An advantage of the invention is to provide a crystal oscillator that can change the waveform output of the oscillation signal depending on the purpose of use.

According to an aspect of the invention, a crystal oscillator that outputs an oscillation output signal of an oscillator circuit oscillated by a crystal resonator as a resonation source via a buffer circuit, includes: a plurality of waveform output circuits provided in the buffer circuit, each converting, when inputted, the oscillation output signal into a different waveform and outputting the converted signal; a circuit selection switch that selects any one of the plurality of waveform output circuits as a waveform output circuit of the buffer circuit; and a memory circuit that stores data used by the circuit selection switch to select any one of the waveform output circuits.

It is preferable that, with the crystal oscillator of the aspect of the invention, the oscillator circuit includes a voltage control oscillator circuit having a voltage variable capacitance element and a temperature-compensating voltage generator circuit that performs temperature compensation using the voltage variable capacitance element, and that the memory circuit stores temperature compensation data used to compensate the temperature characteristics of the crystal resonator.

It is preferable that the crystal oscillator of the aspect of the invention is composed at least of the oscillator circuit, the buffer circuit, the circuit selection switch, and the memory circuit loaded on one chip.

According to the aspect of the invention, the buffer circuit is equipped with: the plurality of waveform output circuits provided in the buffer circuit, each converting, when inputted, the oscillation output signal into a different waveform and outputting the converted signal; the circuit selection switch that selects any one of the plurality of waveform output circuits as the waveform output circuit of the buffer circuit; and the memory circuit that stores data used by the circuit selection switch to select any one of the waveform output circuits. It thus becomes possible to change the waveform output of the oscillation signal that is outputted from the waveform output circuit in accordance with the purpose of use of the crystal oscillator.

As a consequence, a single crystal oscillator may perform as the crystal oscillator that serves a plurality of purposes, and the value of the crystal oscillator may improve.

In particular, it is an advantage of the aspect of the invention that even the crystal oscillator having all the circuit elements except for the crystal resonator integrated on a single-chip IC can change the output waveform of the oscillation signal in accordance with its use.

BRIEF DESCRIPTION OF THE DRAWINGS

The invention will be described with reference to the accompanying drawings, wherein like numbers reference like elements.

DESCRIPTION OF EXEMPLARY EMBODIMENT

An embodiment of the invention will now be described. In the present embodiment, a temperature-compensated crystal oscillator (TCXO) is described as one example of the crystal oscillator of the embodiment of the invention.

Figure 1:
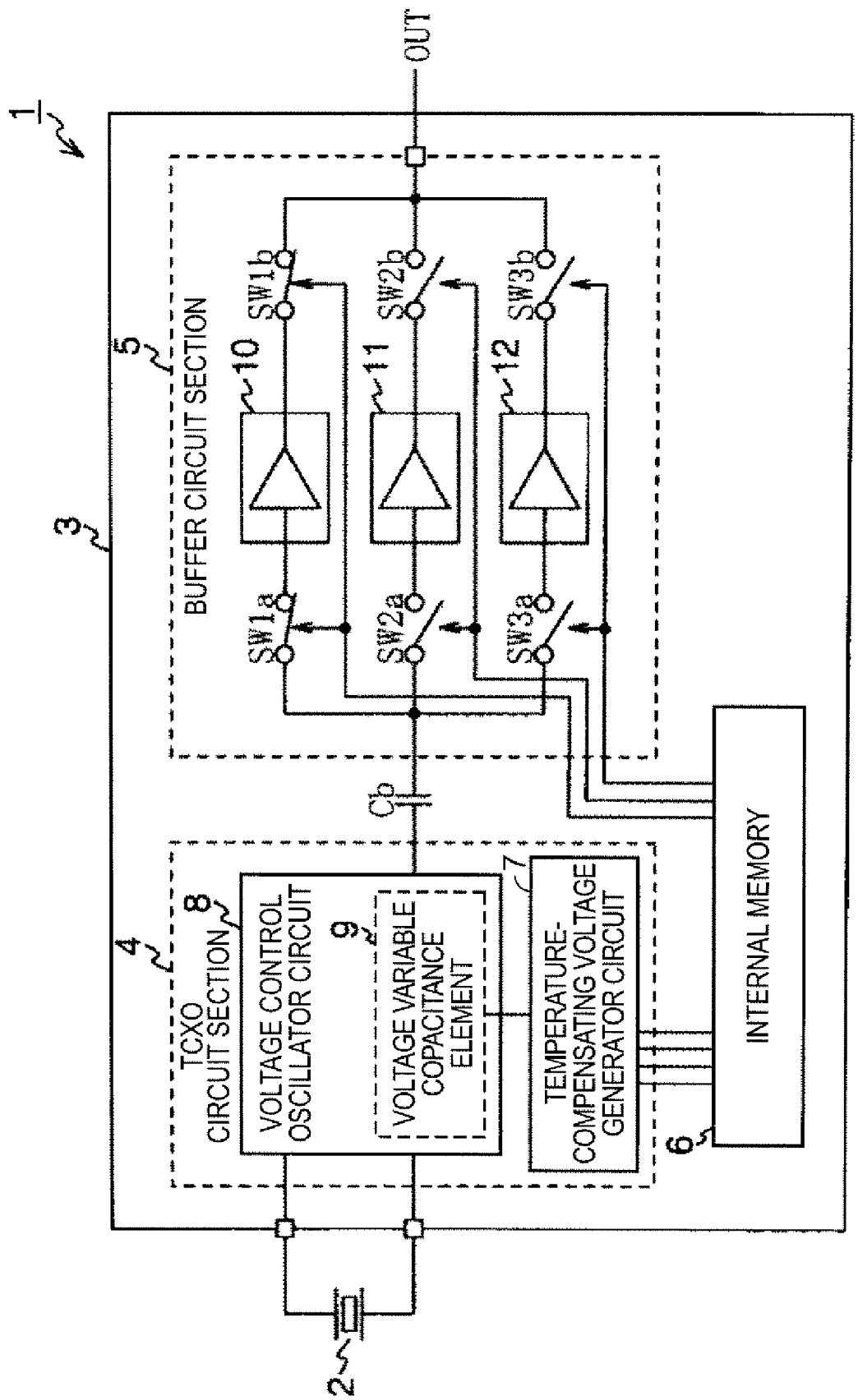
FIG. 1 is a schematic diagram showing the composition of a temperature-compensated crystal oscillator (TCXO) of an embodiment of the invention.

FIG. 1 is a schematic diagram showing the composition of the TCXO of the embodiment of the invention.

A TCXO 1 shown in FIG. 1 is composed of a crystal resonator 2 and a single-chip IC 3. On the single-chip IC 3, a TCXO circuit section 4 excluding the crystal resonator 2, a buffer circuit section 5, and an internal memory circuit 6 are integrated. The TCXO circuit section 4 is equipped with a temperature-compensating voltage generator circuit 7, a voltage variable capacitance element 9, and a voltage control oscillator circuit 8 capable of oscillation frequency control by the voltage.

The internal memory circuit 6 stores setting parameters of the temperature-compensating voltage generator circuit 7 that outputs a temperature-compensating voltage in order to compensate the frequency temperature characteristics of the crystal resonator 2.

The buffer circuit section 5 applies impedance conversion or the like to the oscillation output signal from the TCXO circuit section 4 and outputs the inverted signal as an oscillation signal. Between the buffer circuit section 5 and the TCXO circuit section 4, there is a coupling capacitor Cb to couple an output of the voltage control oscillator circuit 8 of the TCXO circuit section 4 with an input of the buffer circuit section 5.

The buffer circuit section 5 includes a sine wave output circuit 10, a clipped sine wave output circuit 11, and a CMOS level output circuit 12 as waveform output circuits that apply impedance conversion to the oscillation output signal from the TCXO circuit section 4 and output the converted signal to the outside.

In the input/output line of the sine wave output circuit 10, switches SW1a and SW1b, respectively, are inserted as circuit selection switches. Similarly, in the input/output line of the clipped sine wave output circuit 11, switches SW2a and SW2b, respectively, are inserted as the circuit selection switches. In the input/output line of the CMOS level output circuit 12, switches SW3a and SW3b, respectively, are inserted as the circuit selection switches.

By turning on any of these switches SW1a and SW1b, SW2a and SW2b, and SW3a and SW3b, one of the waveform output circuits is selected.

Figure 2:
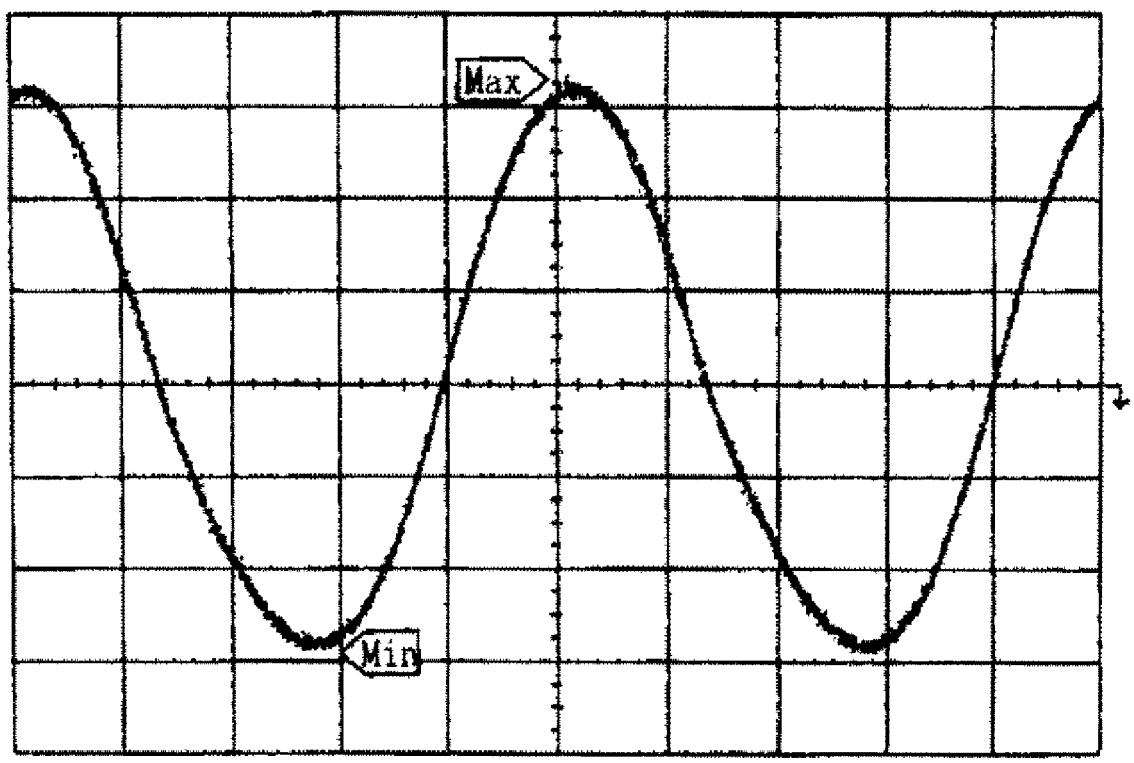
FIG. 2 is a graph showing an output waveform of a sine wave signal.
Figure 3:
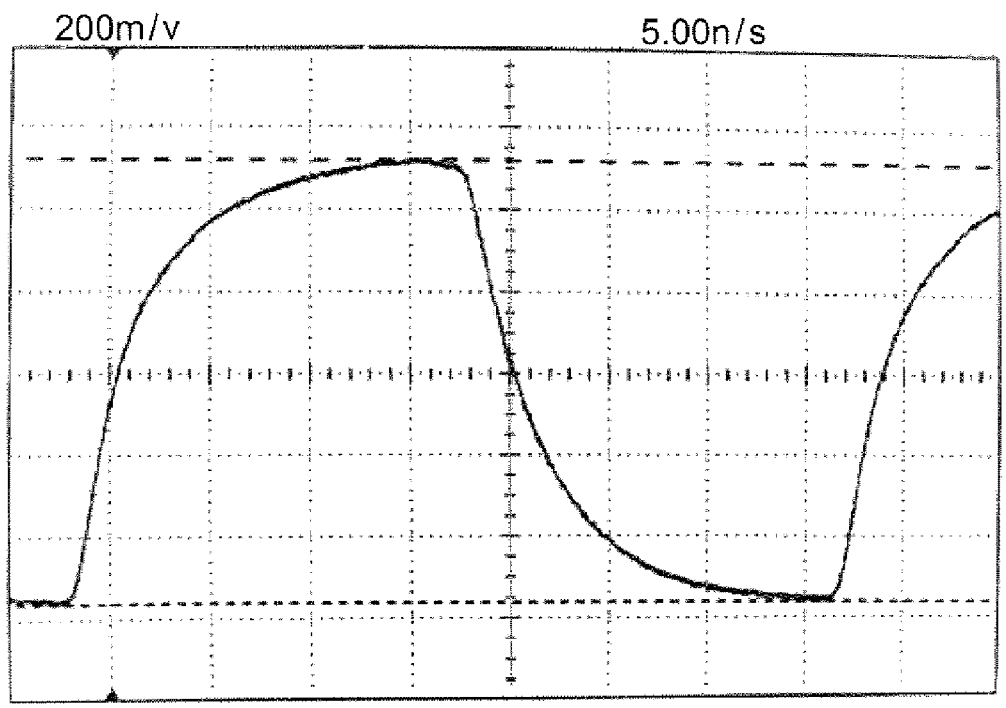
FIG. 3 is a graph showing an output waveform of a clipped sine wave signal.

For example, if it is desired to output the sine wave signal shown in FIG. 2, only the pair of switches SW1a and SW1b is turned on, and all the other switches SW2a, SW2b, SW3a, and SW3b are turned off so as to select the sine wave output circuit 10 as the buffer circuit.

If only the function of each of the waveform output circuits is to be selected, only the switches SW1a, SW2a, and SW3a on the input side of the waveform output circuits are generally needed. However, by adding the switches SW1b, SW2b, and SW3b, unwanted burden on the output end OUT of the TCXO 1 can be prevented, and, thus, the output signal level can become more stable.

In other words, when the sine wave output is desired, the switches excluding SW1a and SW1b are turned off, and only the sine wave output circuit 10 is coupled to the output end OUT of the TCXO 1; therefore, fluctuation in the parasitic capacitance of the output waveform circuits 11 and 12 accompanied with an environmental temperature change, for example, does not affect the oscillation function of the TCXO 1.

Further, each switch may be added between a power source of each of the output waveform circuits and a power supply terminal of the TCXO 1. In this case, if the sine wave output is desired, for example, the switches SW1a, SW1b, and the switch provided between the power source of the sine wave output circuit 10 and the power supply terminal of the TCXO 1 are turned on, while the switches SW2a, SW2b, SW3a, SW3b, and the switch between the output of the waveform output circuit 12 and the power supply terminal of the TCXO 1 are turned off. Electricity is thereby not consumed unnecessarily, and it is possible to maintain low electric power consumption of the TCXO.

Figure 5:
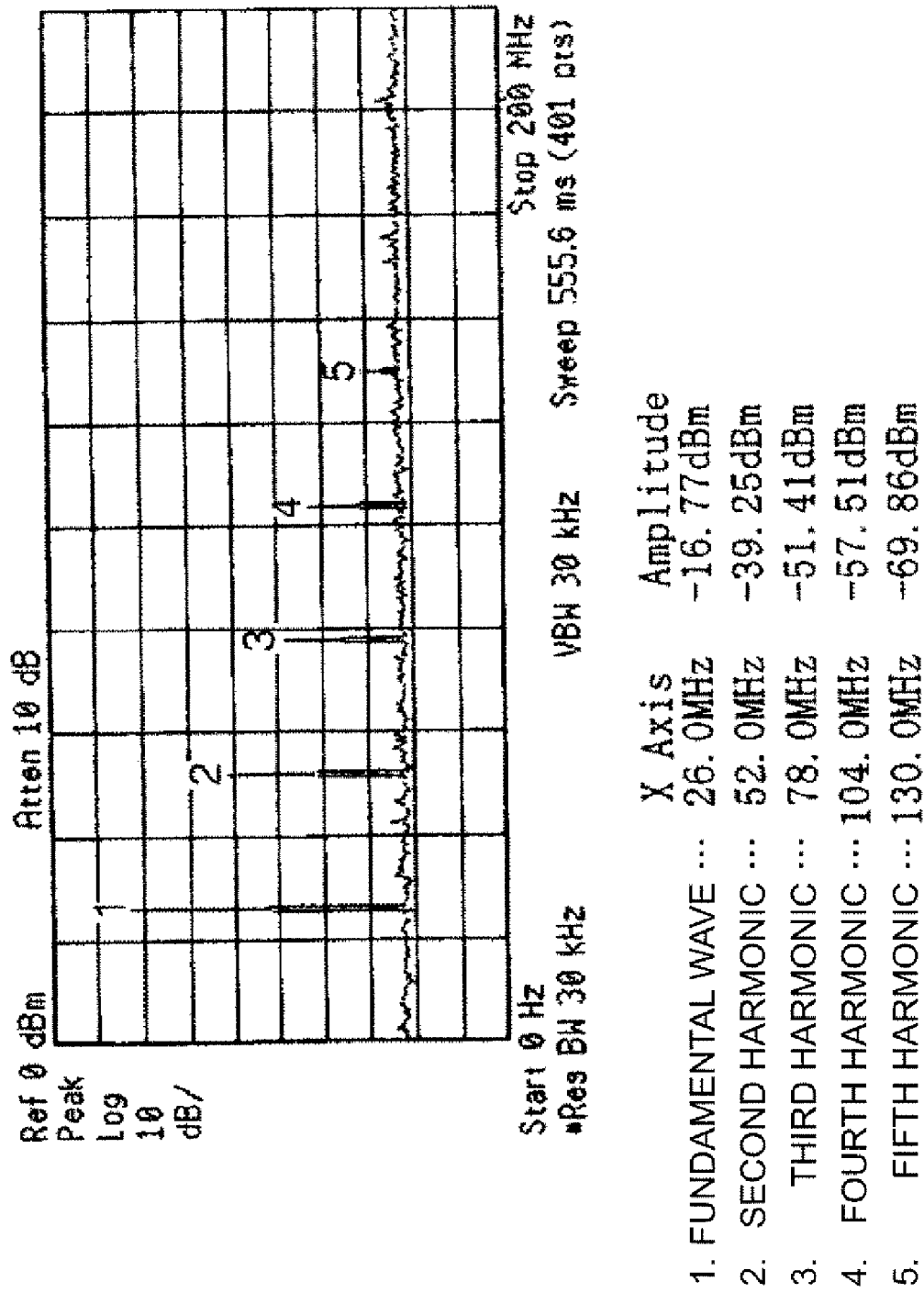
FIG. 5 is a graph showing a harmonic spectrum when the sine wave output circuit is selected.

Furthermore, if it is desired to output an amplitude limit signal (a clipped sine wave) where the amplitude is limited as shown in FIG. 5, only the pair of switches SW2a and SW2b is turned on, while all the other switches SW1a, SW1b, SW3a, SW3b are turned off so that the clipped sine wave output circuit 11 is selected.

Moreover, although not shown in the drawings, if it is desired to output the CMOS level signal, only the pair of switches SW3a and SW3b is turned on, while all the other switches SW1a, SW1b, SW2a, SW2b are turned off so that the clipped sine wave output circuit 11 is selected.

With the TCXO 1 of the embodiment, information as to which one, out of these waveform output circuits 10 through 12, should be selected can be stored in the internal memory circuit 6, and only one pair of switches out of the pairs of switches SW1a and SW1b, SW2a and SW2b, and SW3a and SW3b can be turned on.

Additionally, in reality, the memory information in the internal memory circuit 6 used to select the waveform output circuit is already determined by the time the TCXO 1 is shipped, and the waveform output circuit can not be selected as desired after the shipment.

Hereinafter, the output waveforms of the TXCO1 of the embodiment will be described per each of the waveform output circuits of the buffer circuit section.

First, the output waveform when the sine wave output circuit is selected as the buffer circuit will be described. In this case, data used to turn on only the switches SW1a and SW1b is written into the internal memory circuit 6.

Figure 4:
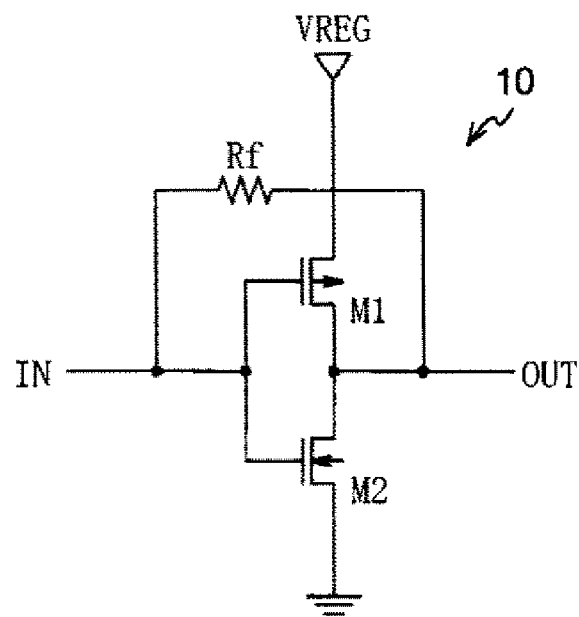
FIG. 4 is a diagram showing the composition of a sine wave output circuit.

FIG. 4 is a diagram showing the circuit composition of the sine wave output circuit.

The sine wave output circuit 10 shown in FIG. 4 is composed of an analog amplifier in which a feedback resister is coupled between the input/output of an inverter amplifier circuit constituted of a p-channel transistor M1 and an n-channel transistor M2. In this case, the output waveform shows linear output characteristics against the inputted oscillation signal.

FIG. 5 is a graph showing a harmonic spectrum when the sine wave output circuit is selected. FIG. 5 shows that, with respect to the fundamental wave, the second harmonic component is −22 dBc or less, and the third harmonic component is −34 dBc or less. Further, as of the phase noise characteristics, FIG. 6 indicates that −150 dBc/Hz or less at the noise floor and −138 dBc/Hz at an offset frequency of 1 kHz are obtained. Accordingly, when the sine wave output circuit 10 is selected as the buffer circuit, it is shown that the TCXO of the embodiment has the low phase noise characteristics (low C/N) and good harmonic noise elimination ratio.

Next, the output waveform when the clipped sine wave output circuit is selected as the buffer circuit will be described. In this case, data used to turn on only the switches SW2a and SW2b is written into the internal memory circuit 6.

Figure 7:
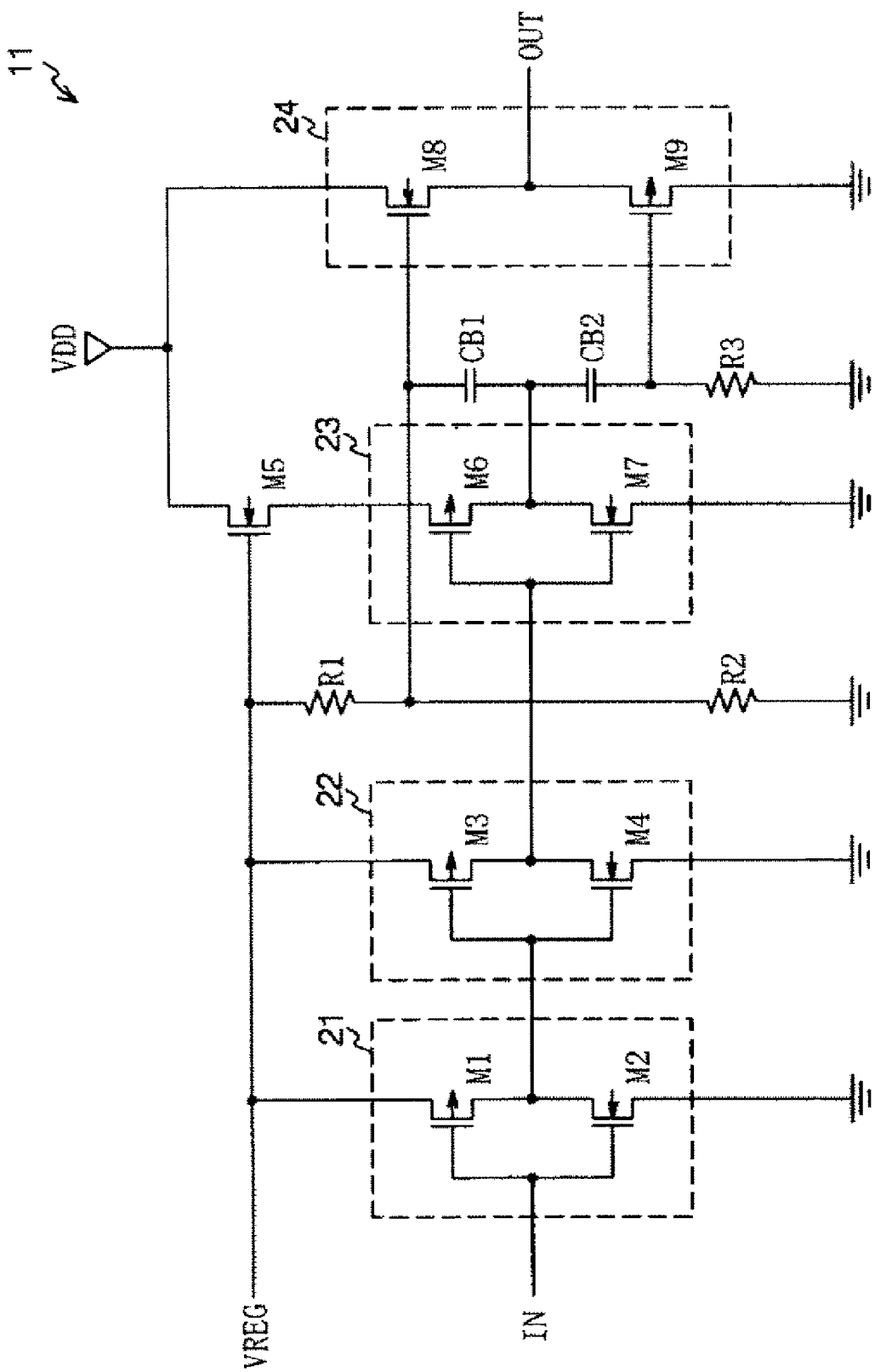
FIG. 7 is a diagram showing the composition of a clipped sine wave output circuit.

FIG. 7 is a diagram showing the composition of the clipped sine wave output circuit.

As shown in FIG. 7, the clipped sine wave output circuit 11 includes: an inverter amplifier 21 in the pre-stage constituted of the p-channel transistor M1 and the n-channel transistor M2, an inverter amplifier 22 constituted of a p-channel transistor M3 and an n-channel transistor M4, and a CMOS push-pull amplifier 24 in the final stage constituted of an n-channel transistor M8 and a p-channel transistor M9 for outputting at low impedance. M5 is a depression type MOS transistor, and, thus, the output amplitude of an inverter amplifier 23 in the third stage constituted of a p-channel transistor M6 and an n-channel transistor M7 becomes (VREG−VGS$_{M5}$). Since the M5 is the depression type MOS transistor, when the reference constant voltage VREG is 2.1V, the amplitude becomes about 1.9Vp-p.

The output signal of the inverter amplifier 23 in the third stage is DC-cut by condensers CB1 and CB2 and inputted into the gates of the n-channel transistor M8 and p-channel transistor M9, respectively. Because the gate voltage of the n-channel transistor M8 has become VG$_{M8}$ due to the voltage division by resistors R1 and R2, when the n-channel transistor M8 is turned on, the p-channel transistor M9, with hardly any VGS left, becomes a cut-off state. Therefore, the final output voltage amplitude stays almost constant at a relation of approximately (VG$_{M8}$−VGS$_{M8}$), without relying on the power source voltage.

For example, when VREG is about 2.1V and VG$_{M8}$ is about 1.8V, the final output signal achieves a constant amplitude of about 1.0Vp-p, although it depends on the drive capability of the n-channel transistor M8.

However, when the power source voltage VDD decreases, the transistor of the power circuit that generates the reference constant voltage enters a saturation region. If (VDD−VREG≧0.2V), however, a constant output signal can easily be obtained in a wide power source voltage range with no particular problem. Generally, if (VDD−VREG≧0.2V), no particular problem occurs, so if VREG=2.1V, the circuit runs steadily up to VDD=2.3V.

The reason to have such a composition is so as to be able to supply, from a direct-current power side (VDD), current to be flowed by the CMOS push-pull amplifier 24 to an output load and current to be used by the inverter amplifier 23 in the third stage to charge condensers CB1 and CB2. Unlike the situation in which the reference constant voltage NREG is used as the power source of the inverter amplifier in the third stage, for example, the load on the power circuit to generate the reference constant voltage is reduced, and the reference voltage VREG becomes stable against high frequency operation. By doing so, the drive capacity of the amplifier for generating the reference constant voltage VREG can be set low. Therefore, the reference constant voltage VREG which is the low noise characteristics can be obtained; unnecessary spectrum components can be eliminated from the output signal; sensitivity to phase modulation due to the noise contained in the VREG can be suppressed; and the phase noise floor is thus effectively improved.

In other words, when the load of the power circuit that generates the reference constant voltage VREG is reduced, the drive capacity of the amplifier that generates the reference constant voltage VREG can be set low, and, therefore, the reference constant voltage VREG which is the low noise characteristics can be obtained. Using such a constant voltage VREG having the low noise characteristics as the power source, the inverter amplifiers in the first and second stages are driven, while the drive of the inverter amplifier in the third stage is controlled by a potential between the gate/source based on the constant voltage VREG. Consequently, it is possible to obtain an output signal that has superb phase noise characteristics (C/N) and is stable against amplitude level fluctuation.

Figure 8:
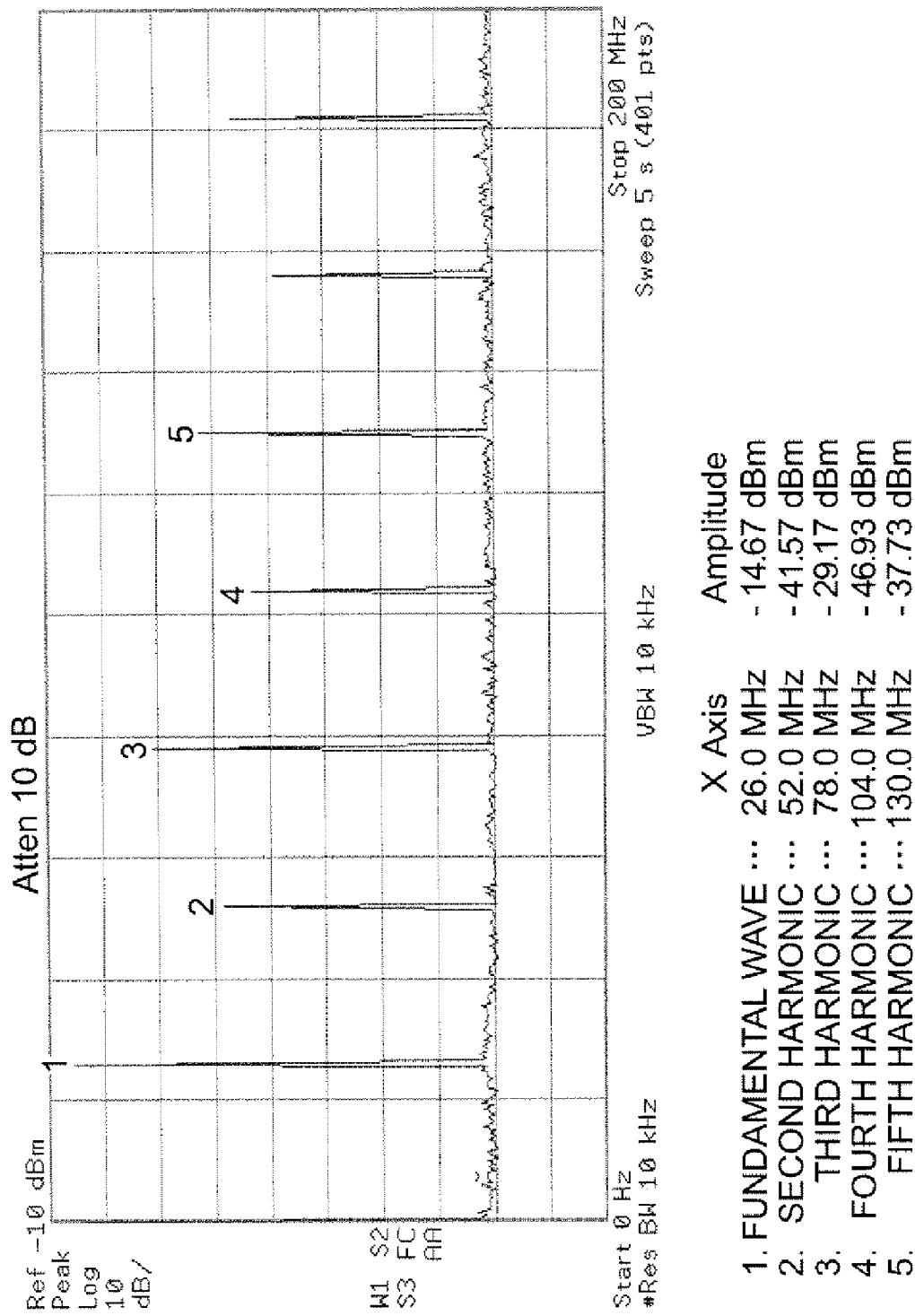
FIG. 8 is a graph showing a harmonic spectrum when the clipped sine wave output circuit is selected.

FIG. 8 is a graph showing the harmonic spectrum when the clipped sine wave output circuit is selected. The harmonic spectrum when the clipped sine wave output circuit is selected is not as good as when the sine wave output circuit shown in FIG. 5 is selected, in that, although the second harmonic component is −26 dBc or less with respect to the fundamental wave, the third harmonic level cannot meet the requirement of −15 dBc or less. The graph indicates that it is difficult to suppress the noise components basically of odd harmonics.

Figure 6:
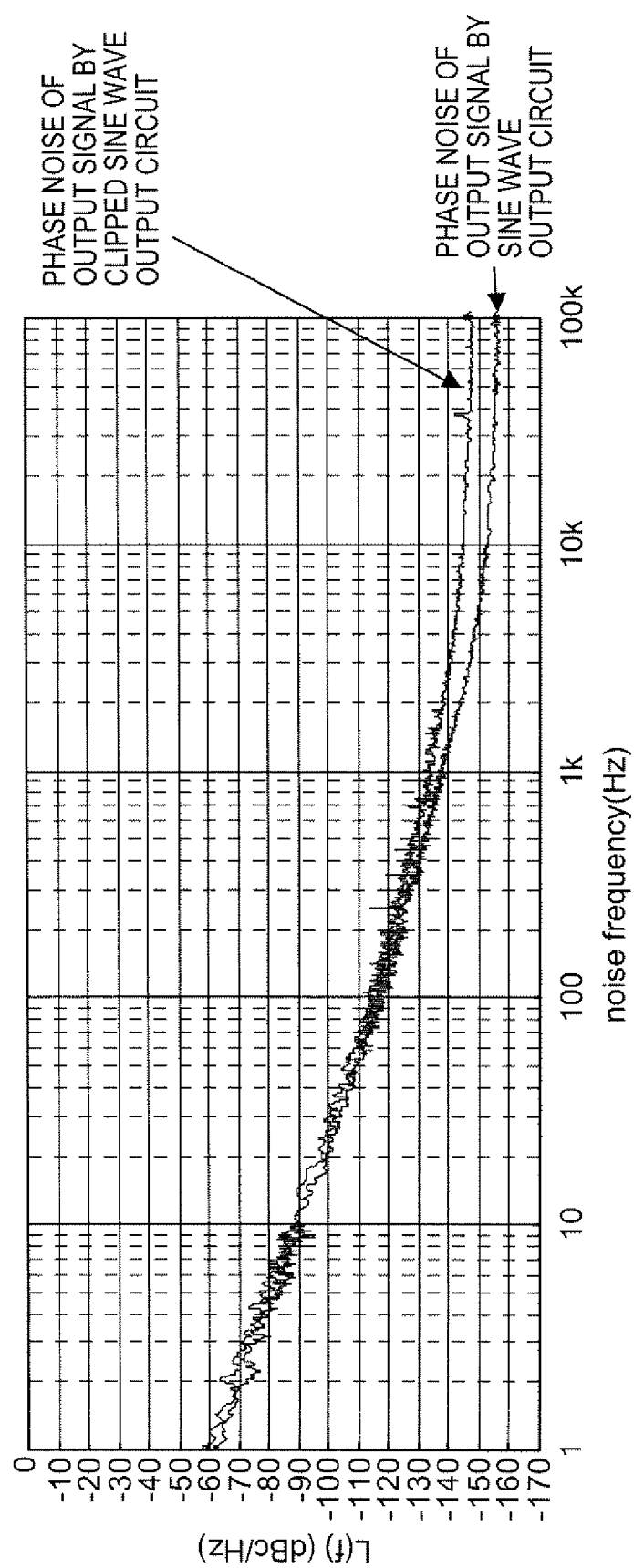
FIG. 6 is a graph showing the noise phase characteristics (C/N) of the TCXO of the embodiment.

Further, as regards the phase noise characteristics shown in FIG. 6, also, in comparison with when the sine wave output circuit is selected, the spectrum is about −148 dBc/Hz at the noise floor and about −134 dBc/Hz at the offset frequency of 1 kHz.

Therefore, when the clipped sine wave output circuit 11 is selected as the buffer circuit it cannot be said that the spectrum has the low phase noise characteristics or good harmonic noise elimination ratio. However, it has an advantage that it resists the output load fluctuation well, since the final stage of the output circuit is the low impedance output.

Next, the output waveform when the CMOS level output circuit is selected as the buffer circuit will be described. In this case, data used to turn on only the switches SW3a and SW3b is written in the internal memory circuit 6.

Figure 9:
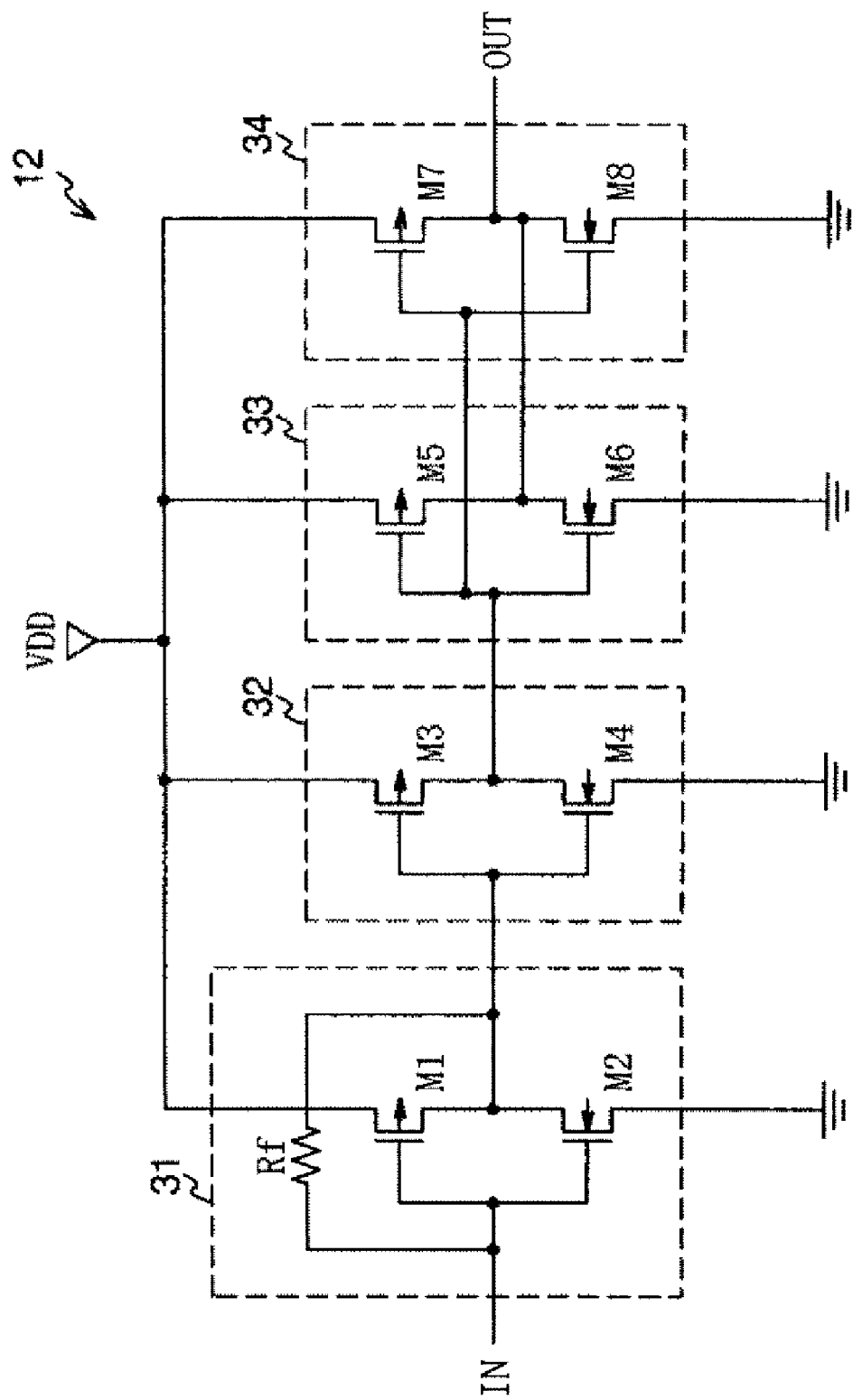
FIG. 9 is a diagram showing the composition of a CMOS level output circuit.
Figure 10:
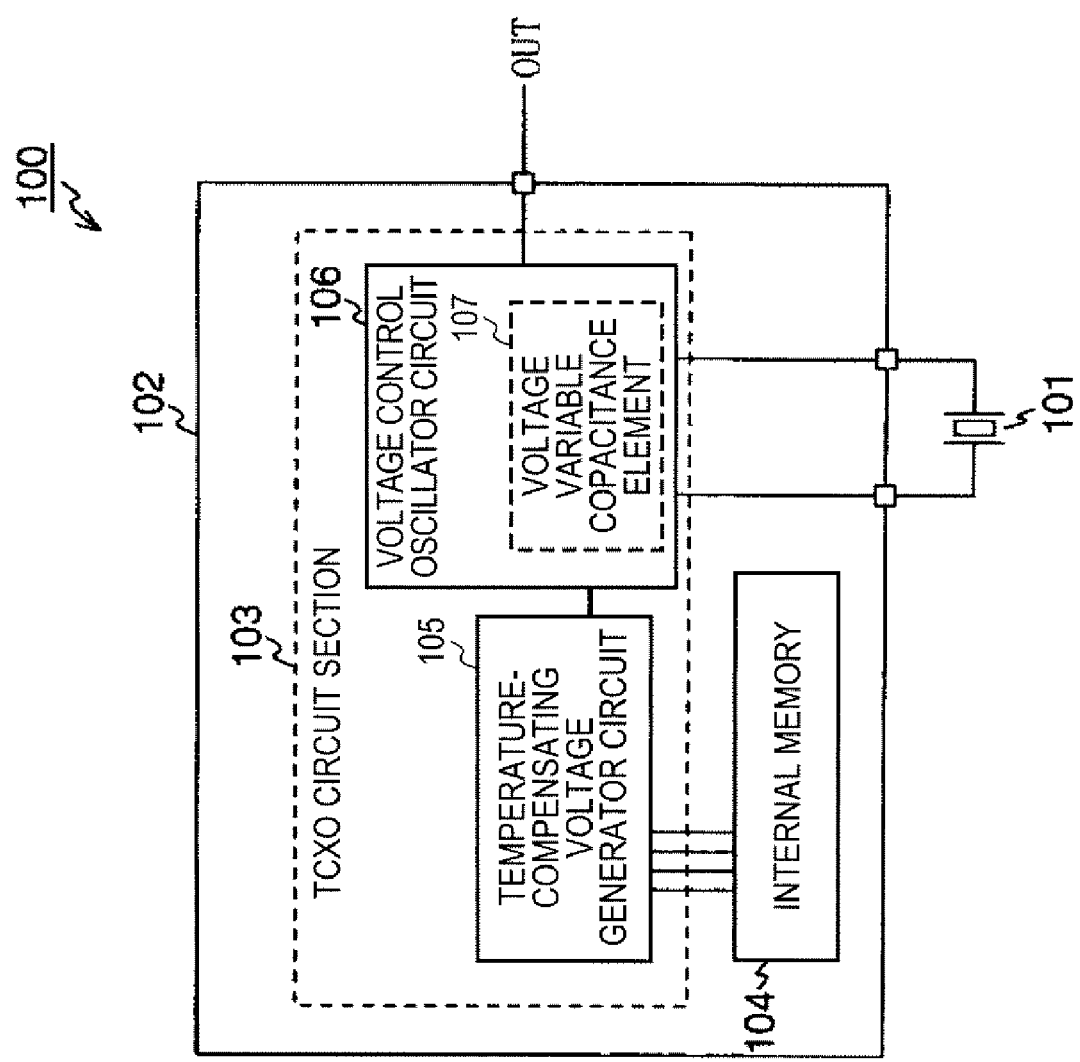
FIG. 10 is a schematic diagram showing the composition of a conventional TCXO.

FIG. 9 is a diagram showing the composition of the CMOS level output circuit.

As shown in FIG. 9, the CMOS level output circuit 12 includes: an analog amplifier 31 in which the feedback resistor Rf is coupled between the input/output of the inverter amplifier circuit constituted of the p-channel transistor M1 and the n-channel transistor M2, an inverter amplifier 32 constituted of the p-channel transistor M3 and the n-channel transistor M4, an inverter amplifier 33 constituted of the p-channel transistor M5 and the n-channel transistor M6, and an inverter amplifier 34 constituted of the p-channel transistor M7 and the n-channel transistor M8, with the inverter amplifiers 33 and 34 being coupled in parallel.

When the CMOS level output circuit 12 having such a composition is selected as the buffer circuit, the TCXO suitable for use of transmission can be realized.

As thus described, the TCXO of the embodiment is provided with the sine wave output circuit 10, the clipped sine wave output circuit 11, and the CMOS level output circuit 12 as the waveform output circuits in the buffer circuit section 5, and is capable of selecting any of the waveform output circuits at the time of shipment. Therefore, having such a composition, a single TCXO can perform as the crystal oscillator that serves for a plurality of purposes, and the value of the TCXO can improve.

For example, by selecting the sine wave output circuit 10 as the waveform output circuit, the TCXO having the low phase noise characteristics and good harmonic noise elimination ratio can be composed. Also, by selecting the clipped sine wave output circuit 11 as the waveform output circuit, the TXCO having strong resistance to the output load fluctuation without much degrading the noise characteristics and harmonic noise elimination ratio. Further, by selecting the CMOS level output circuit 12 as the waveform output circuit, the TXCO suitable for use of transmission can be composed.

Particularly, with the TCXO of the embodiment, it is possible to change the output waveform of the oscillation signal of the oscillation circuit even when the TCXO has all the circuit elements except for the crystal resonator 2 integrated on the single-chip IC 3, which has been difficult conventionally.

In addition, in the embodiment, although the sine wave output circuit 10, the clipped sine wave output circuit 11, and the CMOS level output circuit 12 are exemplified as the waveform output circuits, they are merely examples, and any waveform output circuits that produce waveform outputs in accordance with the uses of the crystal oscillator may be provided.

Moreover, in the embodiment, although the buffer circuit section 5 is provided with three waveform output circuits, the buffer circuit section 5 may be provided with any number of waveform output circuits.

Further, in the embodiment, although the temperature compensated crystal oscillator (TCXO) is exemplified as one example of the crystal oscillator of the invention, the invention is certainly applicable to any crystal oscillator other than the TCXO.

The entire disclosure of Japanese Patent Application No. 2005-223465, filed Aug. 1, 2005 is expressly incorporated by reference herein.

What is claimed is:

1. A crystal oscillator that outputs an oscillation output signal of an oscillator circuit oscillated by a crystal resonator as a resonation source via a buffer circuit, comprising:

a plurality of waveform output circuits provided in the buffer circuit, each converting, when inputted, the oscillation output signal into a different waveform and outputting the converted signal;

a circuit selection switch that selects any one of the plurality of waveform output circuits as a waveform output circuit of the buffer circuit; and a memory circuit that stores data used by the circuit selection switch to select any one of the waveform output circuits.

2. The crystal oscillator according to claim 1, wherein:

the oscillator circuit includes a voltage control oscillator circuit having a voltage variable capacitance element and a temperature-compensating voltage generator circuit that performs temperature compensation using the voltage variable capacitance element; and the memory circuit stores temperature compensation data used to compensate the temperature characteristics of the crystal resonator.

3. The crystal oscillator according to claim 1, wherein the crystal oscillator is composed at least of the oscillator circuit, the buffer circuit, the circuit selection switch, and the memory circuit loaded on one chip.

* * * * *